(12) United States Patent
Huang et al.

(10) Patent No.: US 12,399,438 B2
(45) Date of Patent: *Aug. 26, 2025

(54) METHOD AND APPARATUS FOR REMOVING CONTAMINATION

(71) Applicant: TAIWAN SEMICONDUCTOR MANUFACTURING COMPANY, LTD., Hsinchu (TW)

(72) Inventors: Yu-Chih Huang, Hsinchu (TW); Yu-Kai Chiou, Taipei (TW); Chieh-Jen Cheng, Hsinchu (TW); Li-Jui Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/231,416

(22) Filed: Aug. 8, 2023

(65) Prior Publication Data

US 2023/0375952 A1 Nov. 23, 2023

Related U.S. Application Data

(62) Division of application No. 17/487,006, filed on Sep. 28, 2021, now Pat. No. 12,287,589.

(60) Provisional application No. 63/166,895, filed on Mar. 26, 2021.

(51) Int. Cl.
*G03F 7/20* (2006.01)
*G03F 7/00* (2006.01)

(52) U.S. Cl.
CPC .................. *G03F 7/70925* (2013.01)

(58) Field of Classification Search
CPC .. G03F 7/70925; G03F 7/707; G03F 7/70933; G03F 7/2004
See application file for complete search history.

(56) References Cited

U.S. PATENT DOCUMENTS

| | | |
|---|---|---|
| 4,744,833 A | 5/1988 | Cooper et al. |
| 5,507,874 A | 4/1996 | Su et al. |
| 7,041,989 B1 | 5/2006 | Neerhof et al. |
| 7,245,357 B2 | 7/2007 | Van Zwet et al. |
| 9,312,163 B2 | 4/2016 | Tanaka et al. |
| 10,459,353 B2 | 10/2019 | Chien et al. |
| 11,016,402 B2 | 5/2021 | Van Duivenbode et al. |
| 2004/0012767 A1 | 1/2004 | Van Elp et al. |

(Continued)

FOREIGN PATENT DOCUMENTS

| | | |
|---|---|---|
| WO | 03/098676 A1 | 11/2003 |
| WO | 2015/154917 A1 | 10/2015 |
| WO | 2019/042682 A1 | 3/2019 |

OTHER PUBLICATIONS

Non-Final Office Action issued in U.S. Appl. No. 17/487,006, dated Feb. 2, 2023.

*Primary Examiner* — Alexander Markoff
(74) *Attorney, Agent, or Firm* — STUDEBAKER BRACKETT PLLC

(57) ABSTRACT

Cleaning equipment for an EUV wafer chuck or clamp, which removes particles that have accumulated between burls on the surface of the wafer chuck. The equipment includes a spinning bi-polar electrode placed in proximity to the surface, which can attract and adsorb the charged particle residue therefrom using its generated symmetric electric field when the wafer chuck is not in use.

20 Claims, 8 Drawing Sheets

(56) References Cited

U.S. PATENT DOCUMENTS

| | | |
|---|---|---|
| 2005/0128459 A1 | 6/2005 | Zwet et al. |
| 2010/0136218 A1 | 6/2010 | Parkhe |
| 2011/0037960 A1 | 2/2011 | Scaccabarozzi et al. |
| 2020/0058536 A1 | 2/2020 | Yang et al. |
| 2020/0096881 A1 | 3/2020 | Van Duivenbode et al. |
| 2020/0150549 A1 | 5/2020 | Stevens et al. |
| 2020/0348606 A1 | 11/2020 | Perez-Falcon et al. |
| 2020/0384509 A1 | 12/2020 | Azaria et al. |
| 2022/0308465 A1* | 9/2022 | Huang ................ G03F 7/70925 |
| 2023/0375952 A1* | 11/2023 | Huang ................... G03F 7/707 |

* cited by examiner

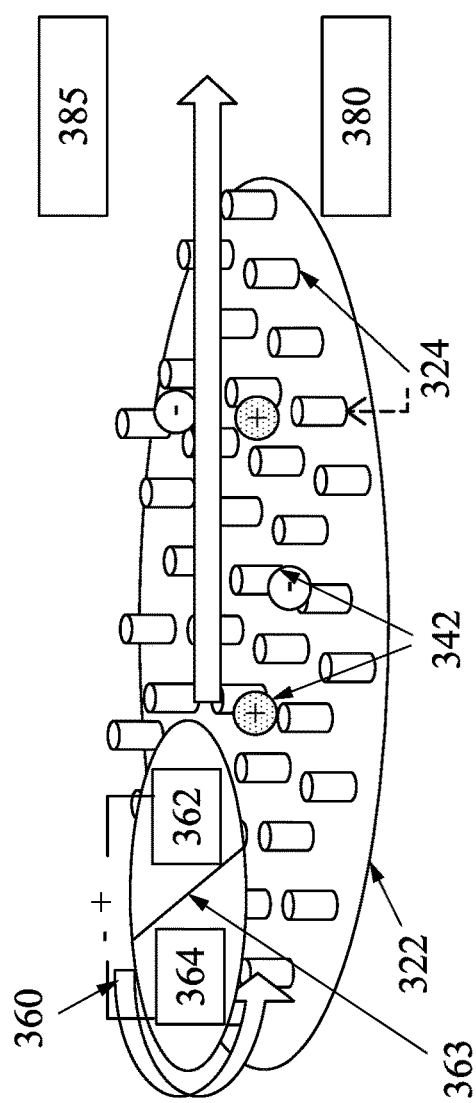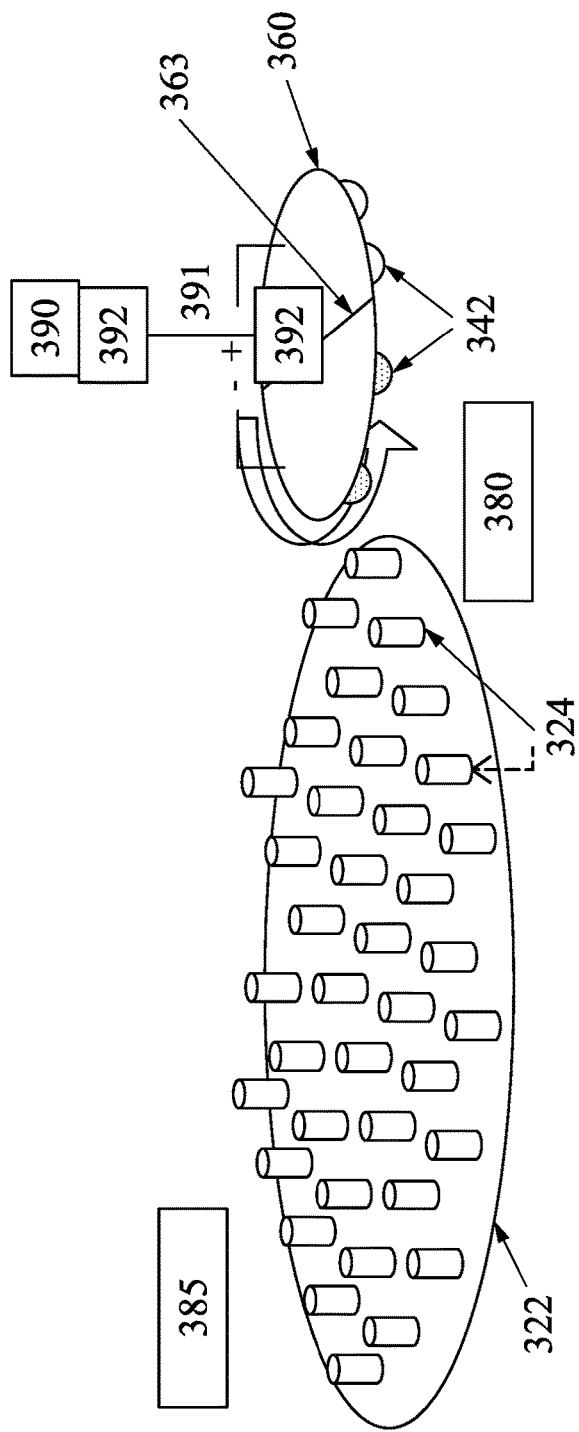
FIG. 3A
FIG. 3B

METHOD AND APPARATUS FOR REMOVING CONTAMINATION

CROSS-REFERENCE TO RELATED APPLICATIONS

This application is a divisional application of U.S. patent application Ser. No. 17/487,006 filed on Sep. 28, 2021, which claims priority under 35 U.S.C. § 119(e) to U.S. Provisional Patent Application No. 63/166,895 entitled "EUV WAFER TABLE CLEANING DEVICE" filed on Mar. 26, 2021, the entirety of which is hereby incorporated by reference.

BACKGROUND

In semiconductor device manufacturing, various types of plasma processes are used to deposit layers of conductive and dielectric material on semiconductor substrates, and also to blanket etch and selectively etch materials from the substrate. One growing technique for semiconductor manufacturing is extreme ultraviolet (EUV) lithography, which employs scanners using light in the EUV spectrum of electromagnetic radiation, including wavelengths from about one nanometer (nm) to about 100 nm. During such processes, the substrate is affixed to a substrate chuck in a process chamber and a plasma is generated adjacent the substrate surface. Various techniques have evolved to affix the substrate to the substrate chuck. For example, an electrostatic chuck (ESC) can be used to hold the substrate during the plasma processes. The use of an electrostatic chuck eliminates the need for mechanical clamp rings, and greatly reduces the probability of forming particles by abrasion etc., which particles cause yield problems and require frequent cleaning of the apparatus.

Even though the use of an electrostatic chuck reduces particle contamination, it is inevitable that small debris particles are nonetheless formed over time, and other contamination is generated within the process chamber during normal operation and/or cleaning. These particles and contamination when deposited or formed on the substrate chuck surface of an ESC increase the leakage of the heat transfer gas at the interface of the chuck surface and substrate. This leakage reduces the temperature control of the substrate and the efficiency of substrate cooling techniques. Consequently, the process chamber and the substrate chuck must be cleaned more frequently. This results in down-time for the apparatus, and requires an expensive and time consuming manual apparatus cleaning operation. Therefore, there is a need for improving the cleaning process without substantial down-time.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3A is a first diagram of a spinning electrode and a wafer clamp in accordance with some embodiments.

FIG. 3B is a second diagram of a spinning electrode and a wafer clamp in accordance with some embodiments.

DETAILED DESCRIPTION

Figure 1A:
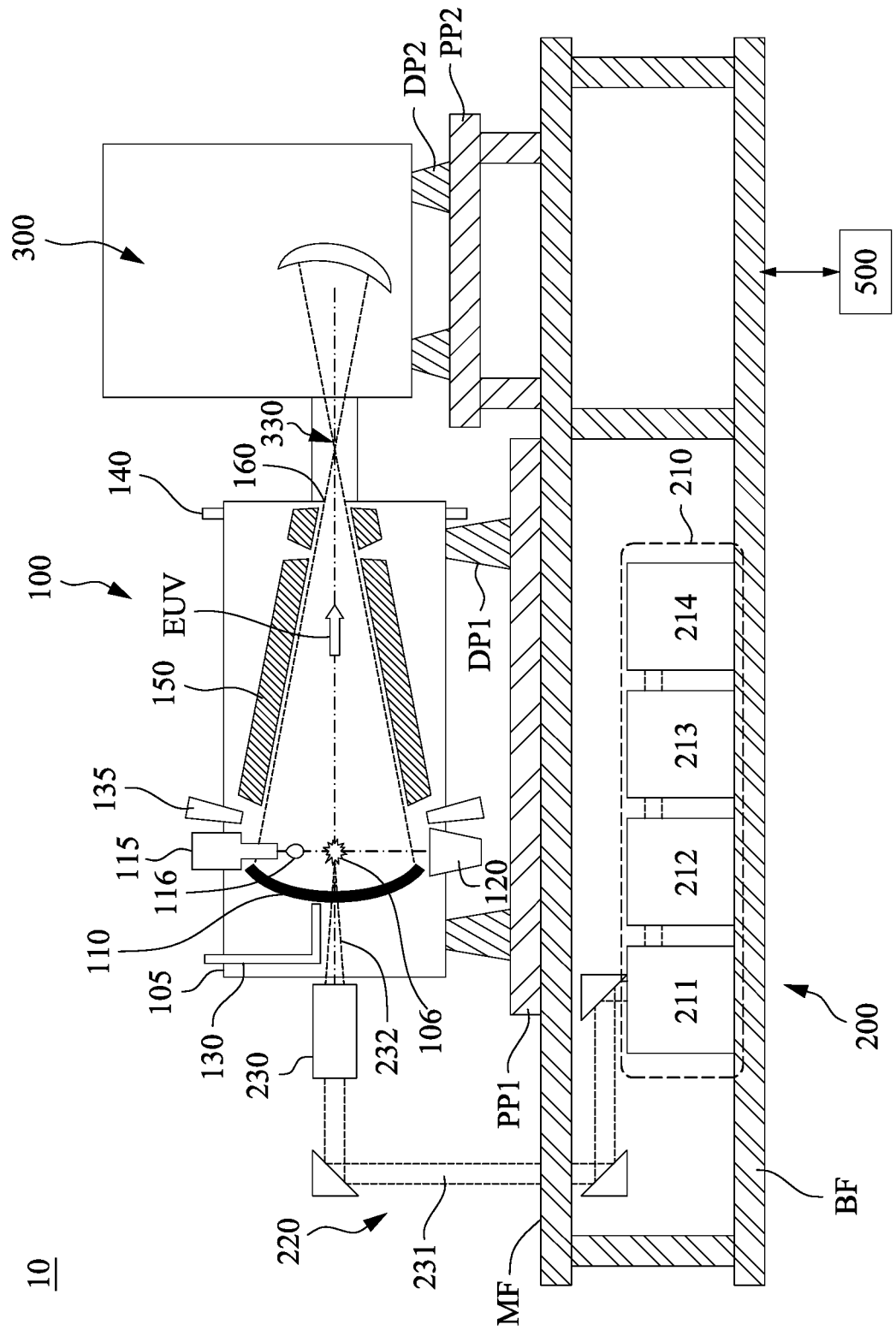
FIG. 1A is a diagram of a lithography apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and also include embodiments in which additional features are formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic," as used herein, is not meant to be limited to components which operate solely within one or more specific wavelength range(s) such as at the EUV output light wavelength, the irradiation laser wavelength, a wavelength suitable for metrology or any other specific wavelength.

In the present disclosure, the terms "mask," "photomask," and "reticle" are used interchangeably. In the present embodiment, the mask is a reflective mask. One embodiment of the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers deposited on the substrate. The multiple layers include a plurality of film pairs, such as molybdenum-silicon (Mo/Si) film pairs (e.g., a layer of molybdenum above or below a layer of silicon in each film pair). Alternatively, the multiple layers may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the multiple layers. The absorption layer is patterned to define a layer of an integrated circuit (IC). Alternatively, another reflective layer may be deposited over the multiple layers and is patterned to define a layer of an integrated circuit, thereby forming an EUV phase shift mask.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform various lithography exposing processes. The lithography system may further include other modules or be integrated with (or be coupled with) other modules.

A lithography system is essentially a light projection system. Light is projected through a 'mask' or 'reticle' that constitutes a blueprint of the pattern that will be printed on a workpiece. The blueprint is four times larger than the intended pattern on the wafer or chip. With the pattern encoded in the light, the system's optics shrink and focus the pattern onto a photosensitive silicon wafer. After the pattern is printed, the system moves the wafer slightly and makes another copy on the wafer. This process is repeated until the wafer is covered in patterns, completing one layer of the eventual semiconductor device. To make an entire microchip, this process will be repeated one hundred times or more, laying patterns on top of patterns. The size of the features to be printed varies depending on the layer, which means that different types of lithography systems are used for different layers, from the latest-generation EUV systems for the smallest features to older deep ultraviolet (DUV) systems for the largest.

FIG. 1A is a schematic and diagrammatic view of an EUV lithography system 10. The EUV lithography system 10 includes an EUV radiation source apparatus 100 (sometimes referred to herein as a "source side" in reference to it or one or more of its relevant parts) to generate EUV light, an exposure tool 300, such as a scanner, and an excitation laser source apparatus 200. As shown in FIG. 1A, in some embodiments, the EUV radiation source apparatus 100 and the exposure tool 300 are installed on a main floor (MF) of a clean room, while the excitation laser source apparatus 200 is installed in a base floor (BF) located under the main floor. Each of the EUV radiation source apparatus 100 and the exposure tool 300 are placed over pedestal plates PP1 and PP2 via dampers DP1 and DP2, respectively. The EUV radiation source apparatus 100 and the exposure tool 300 are coupled to each other at a junction 330 by a coupling mechanism, which may include a focusing unit (not shown).

The EUV lithography system 10 is designed to expose a resist layer to EUV light (or EUV radiation). The resist layer is a material sensitive to the EUV light. The EUV lithography system 10 employs the EUV radiation source apparatus 100 to generate EUV light having a wavelength ranging between about 1 nanometer (nm) and about 100 nm. In one embodiment, the EUV radiation source apparatus 100 generates EUV light with a wavelength centered at about 13.5 nm. In various embodiments, the EUV radiation source apparatus 100 utilizes laser produced plasma (LPP) to generate the EUV radiation.

As shown in FIG. 1A, the EUV radiation source apparatus 100 includes a target droplet generator 115 and an LPP collector 110, enclosed by a chamber 105. The target droplet generator 115 generates a plurality of target droplets 116. In some embodiments, the target droplets 116 are tin (Sn) droplets. In some embodiments, the target droplets 116 have a diameter of about 30 microns ($\mu m$). In some embodiments, the target droplets 116 are generated at a rate of about fifty droplets per second and are introduced into an excitation zone 106 at a speed of about seventy meters per second (m/s or mps). Other material can also be used for the target droplets 116, for example, a liquid material such as a eutectic alloy containing Sn and lithium (Li).

As the target droplets 116 move through the excitation zone 106, pre-pulses (not shown) of the laser light first heat the target droplets 116 and transform them into lower-density target plumes. Then, the main pulse 232 of laser light is directed through windows or lenses (not shown) into the excitation zone 106 to transform the target plumes into an LPP. The windows or lenses are composed of a suitable material substantially transparent to the pre-pulses and the main pulse 232 of the laser. The generation of the pre-pulses and the main pulse 232 is synchronized with the generation of the target droplets 116. In various embodiments, the pre-heat laser pulses have a spot size about 100 $\mu m$ or less, and the main laser pulses have a spot size about 200-300 $\mu m$. A delay between the pre-pulse and the main pulse 232 is controlled to allow the target plume to form and to expand to an optimal size and geometry. When the main pulse 232 heats the target plume, a high-temperature LPP is generated. The LPP emits EUV radiation, which is collected by one or more mirrors of the LPP collector 110. More particularly, the LPP collector 110 has a reflection surface that reflects and focuses the EUV radiation for the lithography exposing processes. In some embodiments, a droplet catcher 120 is installed opposite the target droplet generator 115. The droplet catcher 120 is used for catching excess target droplets 116 for example, when one or more target droplets 116 are purposely or otherwise missed by the pre-pulses or main pulse 232.

As shown, the target droplet generator 115 generates tin droplets along a vertical axis. Each droplet is hit by a $CO_2$ laser pre-pulse (PP). The droplet will responsively change its shape into a "pancake" during its travel along the axial direction. After a time duration (PP to MP delay time), the pancake is hit by a $CO_2$ laser main pulse (MP) proximate to a primary focus (PF) in order to generate an EUV light pulse.

The EUV light pulse is then collected by an LPP collector 100 and delivered to the exposure tool 300 for use in wafer exposure.

The LPP collector 110 includes a proper coating material and shape to function as a mirror for EUV collection, reflection, and focusing. In some embodiments, the LPP collector 110 is designed to have an ellipsoidal geometry. In some embodiments, the coating material of the collector 100 is similar to the reflective multilayer of an EUV mask. In some examples, the coating material of the LPP collector 110 includes multiple layers, such as a plurality of molybdenum/silicon (Mo/Si) film pairs, and may further include a capping layer (such as ruthenium (Ru)) coated on the multiple layers to substantially reflect the EUV light.

The main pulse 232 is generated by the excitation laser source apparatus 200. In some embodiments, the excitation laser source apparatus 200 includes a pre-heat laser and a main laser. The pre-heat laser generates the pre-pulse that is used to heat or pre-heat the target droplet 116 in order to create a low-density target plume, which is subsequently heated (or reheated) by the main pulse 232, thereby generating increased emission of EUV light.

The excitation laser source apparatus 200 may include a laser generator 210, laser guide optics 220 and a focusing apparatus 230. In some embodiments, the laser generator 210 includes a carbon dioxide ($CO_2$) laser source or a neodymium-doped yttrium aluminum garnet (Nd:YAG) laser source. The laser light 231 generated by the laser generator 210 is guided by the laser guide optics 220 and focused into the main pulse 232 of the excitation laser by the focusing apparatus 230, and then introduced into the EUV radiation source apparatus 100 through one or more apertures, such as the aforementioned windows or lenses.

In such an EUV radiation source apparatus 100, the LPP generated by the main pulse 232 creates physical debris, such as ions, gases and atoms of the droplet 116, along with the desired EUV light. In operation of the lithography system 10, there is an accumulation of such debris on the LPP collector 110, and such physical debris exits the chamber 105 and enters the exposure tool 300 (i.e., the "scanner side") as well as the excitation laser source apparatus 200.

In various embodiments, a buffer gas is supplied from a first buffer gas supply 130 through the aperture in the LPP collector 110 by which the main pulse 232 of laser light is delivered to the tin droplets 116. In some embodiments, the buffer gas is hydrogen ($H_2$), helium (He), argon (Ar), nitrogen ($N_2$), or another inert gas. In certain embodiments, $H_2$ is used, since H radicals generated by ionization of the buffer gas can also be used for cleaning purposes. Furthermore, $H_2$ absorbs the least amount of EUV light produced by the source side, and thus absorbs the least light used by the semiconductor manufacturing operations performed in the scanner side of the lithography apparatus 10. The buffer gas can also be provided through one or more second buffer gas supplies 135 toward the LPP collector 110 and/or around the edges of the LPP collector 110. Further, and as described in more detail later below, the chamber 105 includes one or more gas outlets 140 so that the buffer gas is exhausted outside the chamber 105.

Hydrogen gas has low absorption of the EUV radiation. Hydrogen gas reaching to the coating surface of the LPP collector 110 reacts chemically with a metal of the target droplet 116, thus forming a hydride, e.g., metal hydride. When Sn is used as the target droplet 116, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the Sn debris and $SnH_4$ from entering the exposure tool 300 and the excitation laser source apparatus 200. To trap the Sn, $SnH_4$ or other debris, one or more debris collection mechanisms or devices 150 are employed in the chamber 105. In various embodiments, a controller 500 controls the EUV lithography system 10 and/or one or more of its components shown in and described above with respect to FIG. 1A.

Figure 1B:
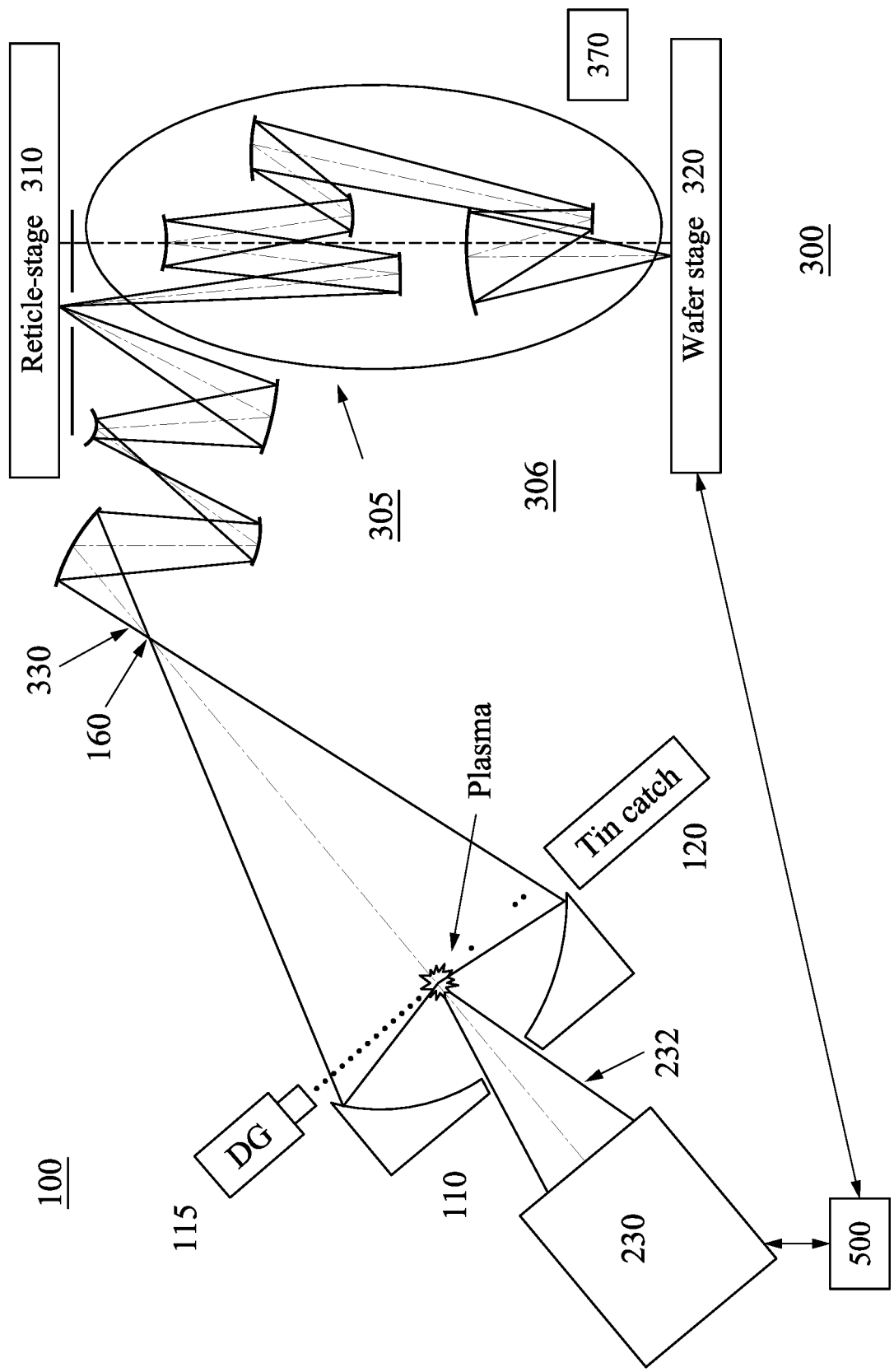
FIG. 1B is a diagram of a source side and a scanner side in accordance with some embodiments.

As shown in FIG. 1B, the exposure tool 300 (sometimes referred to herein as the "scanner side" in reference to it or one or more of its relevant parts) includes various reflective optic components, such as convex/concave/flat mirrors, a mask holding mechanism 310 including a mask stage (i.e., a reticle stage), and wafer holding mechanism 320. The EUV radiation generated by the EUV radiation source apparatus 100 and focused at the intermediate focus 160 is guided by the reflective optical components 305 onto a mask (not shown) secured on the reticle stage 310, also referenced as a "mask stage" herein, within the processing chamber 306. In various embodiments of the EUV lithography system 10, pressure in the LPP source side is higher than pressure in the scanner side. This is because the source side uses hydrogen gas to force the removal of airborne Sn debris therefrom, while the scanner side is maintained in near vacuum in order to avoid diminishing the strength of the EUV light (being absorbed by air molecules) or otherwise interfering with the semiconductor manufacturing operations performed therein. In various embodiments, the intermediate focus 160 is disposed at the junction 330, namely, the intersection of the source side and the scanner side.

In some embodiments, the distance from the intermediate focus 160 and the reticle disposed in the scanner side is approximately 2 meters. In some embodiments, the reticle size is approximately 152 mm by 152 mm. In some embodiments, the reticle stage 310 includes an electrostatic chuck, or 'e-chuck,' to secure the mask. The EUV light patterned by the mask is used to process a wafer supported on wafer stage 320. Because gas molecules absorb EUV light, the chambers and areas of the lithography system 10 used for EUV lithography patterning are maintained in a vacuum or a low-pressure environment to avoid EUV intensity loss. Nonetheless, a debris collector 370, similar in purpose and design to the debris collector 150, may be provided in the scanner side to dispose of and remove contamination and residue that may accumulate in the components of the scanner side. In various embodiments, the controller 500 controls one or more of the components of the EUV lithography system 10 as shown in and described with respect to FIG. 1B.

Figures 2A, 2B:
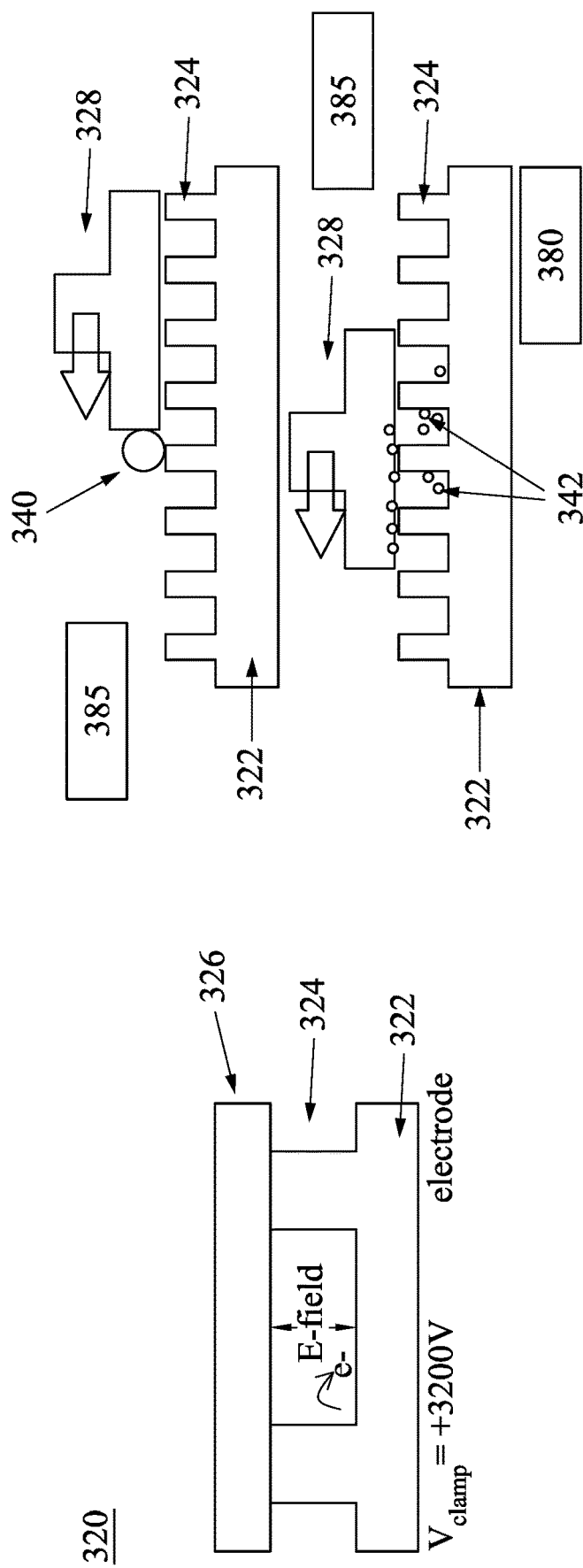
FIG. 2A is a diagram of a wafer stage in accordance with some embodiments.
FIG. 2B is a diagram of a stone cleaning process in accordance with some embodiments.

FIG. 2A is a diagram of a wafer stage 320 in accordance with some embodiments. The wafer stage 320 includes a wafer clamp 322, also referred to herein as a wafer chuck. In various embodiments, the wafer chuck 322 is an electrostatic chuck (ESC) disposed within the process chamber 306, and the ESC is configured to receive a substrate 326. In accordance with various embodiments, the substrate 326 includes a wafer, silicon substrate, or any other wafer, workpiece or substrate. In various embodiments, the apparatus 10 also includes an internal chuck electrode (not shown), and a source of direct current (DC) power connected to the chuck electrode in order to provide power thereto.

In various embodiments, the substrate 326 is clamped by the electrostatic chuck 322 by an electrostatic potential. In various embodiments, when a DC voltage from the source of DC power (not shown) is applied to the chuck electrode of the electrostatic chuck 322 having the substrate 326 disposed thereon, a Coulomb force is generated between the substrate 326 and the chuck electrode. The Coulomb force attracts and holds the substrate 326 on the electrostatic chuck 322 until the application of the DC voltage from the source of DC power is discontinued. In various embodiments, the applied DC voltage ranges from about 2000 volts to about 3200 volts. In some embodiments, the applied DC voltage is 3000 volts. In some embodiments, the source of DC power is configured to apply the DC voltage of about 10% to about 90% of the power applied during normal etching operations using direct current. In some embodiments, the source of DC power is configured to apply the DC voltage of about 20% to about 80%, about 30% to about 70%, or about 30% to about 50% of the power applied during normal lithography operations using direct current. In some embodiments, the application of the DC voltage occurs for a duration of about 10 seconds to about 60 seconds, about 10 seconds to about 50 seconds, about 20 seconds to about 40 seconds, or about 20 seconds to about 30 seconds.

In various embodiments, the surface of the electrostatic chuck 322 includes a plurality of burls 324, which have a width in a range from about 100 μm to about 500 μm, a height from the surface of the electrostatic chuck 322 in a range from about 1.0 μm to about 100 μm, and are spaced from each other in a range from about 1.0 μm to about 5.0 μm. In various embodiments, the electrostatic chuck 322 has greater than two thousand such burls 324, comprising roughly 1.5% of the surface area of the surface of the electrostatic chuck 322, in order to support the substrate 326.

In various embodiments, the application of the DC power positively charges particles or contaminants on the surface of the substrate 326. In various embodiments, the application of the DC power negatively charges particles or contaminants on the surface of the wafer clamp 322, which may settle upon the tops of the burls 324. In some embodiments, debris particles or contaminants are generated from the substrate 326 during lithography operations and/or due to the electrostatic action of the wafer clamp 322. The debris particles include, but are not limited to the following elements: Cu, Al, Ni, Ti, O, F, Si, Cu, Al, Ge, Ni, Ti, W, Xi, Mo, Fe, Pb, Bi, and In, or alloys or compounds thereof. In some embodiments, the debris particles include molecules such as: $Si_xO_y$, $Al_xO_y$, and $Ti_xO_y$. The surface debris particles and/or contaminants must be removed from the electrostatic chuck 330 in order to maximize the manufacturing performance of the apparatus 10.

FIG. 2B is a diagram of a stone cleaning process in accordance with some embodiments. The purpose of the stone cleaning is to remove the large debris particles 340 that accumulate on top of the burls 324 of the electrostatic chuck 322 over time and with usage. In various embodiments, the stone cleaning system automatically cleans excessive focus spots caused by debris particles 340 on the burls 324 of the electrostatic chuck 322 without operator intervention. In various embodiments, the stone cleaning system uses a cleaning stone 328 in a holder (not shown) that grinds the burls 324 of the electrostatic chuck 322 as it is moved by a wafer chuck mover 380 underneath the stone 328. In some embodiments, the stone is composed of marble. In various embodiments, the wafer clamp 322 is moved laterally (i.e., back and forth horizontally and/or vertically) and/or circularly (i.e., in expanding concentric circles or spirals) with respect to the stone 328 during this cleaning operation until the entire surface area of the wafer clamp 322 has been treated. In some embodiments, the stone cleaning process is manually performed by an operator.

In various embodiments, the apparatus 10 also includes a spectral and/or charge monitoring system 385. The spectral and/or charge monitoring system 385 is configured to monitor surface charge level and/or composition of debris particles and/or contaminants 340, 342 on the surface of the electrostatic chuck 322. In some embodiments, the spectral and/or charge monitoring system 385 uses x-rays or an ion beam to charge the debris particles and/or contaminants 340, 342 including any by-products. For example, during a stone cleaning operation of the apparatus 10, the spectral and/or charge monitoring system 385 is configured to continuously or periodically monitor surface charge level and/or composition of debris particles and/or contaminants 340, 342. In some embodiments, continuous or periodic monitoring by the spectral and/or charge monitoring system 385 automatically determines when cleaning is needed and/or needs to be continued. In some embodiments, it provides a user with a contamination history or profile of the apparatus 10 throughout its service life, or any time period thereof.

Through use of the spectral and/or charge monitoring system 385, it has been discovered that the stone cleaning process can only clean the large particles 340 that exist on the top of burls 324, and generates additional, smaller, electrically-charged particles 342 that settle between the burls 324 after stone cleaning in some embodiments. These residue particles 342 build up over time with machine usage and interfere with the efficiency and alignment of the electrostatic chuck 322, particularly impacting wafer exposure quality, such as overlay.

It has been found that the smaller residue particles 342 that settle between the burls 324 are not affected by further applications of the stone cleaning process, yet the particles 342 should nonetheless be removed. Accordingly, a spinning bi-polar electrode disk is introduced to sweep across the wafer chuck 322 (while it is inactive) in order to absorb the charged particles 342 that have settled between the burls 324 after stone cleaning in some embodiments.

FIG. 3A is a first diagram of a spinning cleaning electrode 360 provided above the wafer clamp 322 in accordance with some embodiments. In various embodiments, the wafer chuck mover 380 moves the wafer clamp 322 with respect to the spinning cleaning electrode 360. In various embodiments, the wafer clamp 322 is moved laterally (i.e., back and forth and/or left and right horizontally and/or vertically) and/or circularly (i.e., in expanding concentric circles) with respect to the bi-polar cleaning electrode 360 while the electrode is spinning during this additional cleaning operation until the entire surface area of the wafer clamp 322 has been treated. In other embodiments, the bi-polar cleaning electrode 360 moves over the wafer clamp 322 while the wafer clamp 322 is stationary, or both the bi-polar cleaning electrode 360 and the wafer clamp 322 are moved simultaneously.

The bi-polar cleaning electrode 360 is designed for electric adsorption in the near-vacuum environment of the EUV lithography apparatus 10. In various embodiments, the bi-polar cleaning electrode 360 sweeps along the surface of the wafer clamp 322 just above the burls 324, without physical contact. The bi-polar electrode then attracts and adsorbs both positively- and negatively-charged debris particles 342 from between the burls 342 of the wafer clamp 322 using a symmetric rotating bi-polar electric field in various embodiments.

A symmetric electric field yields optimal results for particle attraction and removal of debris particles. This is because an asymmetric electric field jostles particles nonuniformly, namely in various directions including directions away from the surface of the cleaning electrode 360. This, in turn, causes inadvertent and undesirable spreading of the debris particles from the wafer chuck surface into the processing chamber 306.

In order to generate a symmetric electric field using a shaped electrode, it is necessary to use an electrode shape that is substantially symmetrical with at least two axes of symmetry. Shapes that have a single axis of symmetry will not generate symmetric electric fields in all directions. The greater the number of axes of symmetry, the more symmetric the electric field that will be produced. A circle has infinite axes of two-dimensional symmetry. Accordingly, as shown in FIG. 3A, the shape of the cleaning electrode 360 is circular in various embodiments.

In order to generate an electric field, the surface of the cleaning electrode 360 is charged from a power source. In order to be charged, the cleaning electrode 360 is electrically conductive. In order to avoid interference with other components of the apparatus 10, the cleaning electrode 360 is not be magnetic or radioactive in various embodiments. Accordingly, in various embodiments, the cleaning electrode 360 is made of one or more of the following conductive elements (or molecules containing the same) in solid form: silver, copper, gold, aluminum, calcium, beryllium, rhodium, magnesium, molybdenum, tungsten, zinc, cobalt, cadmium, nickel, lithium, iron, platinum, palladium, tin, selenium, tantalum, niobium, chromium, lead, vanadium, antimony, zirconium and titanium. In some embodiments, the cleaning electrode 360 is composed of cast steel or stainless steel.

Applying electric power to a conductive electrode shape will not necessarily generate a bi-polar symmetric field as needed for the present processes using a cleaning electrode. For example, simply applying opposing power leads to opposing surfaces of a circular conductive shape will yield a capacitor-like element where the top surface of the shape is, for example, positively charged, and the bottom surface of the shape is accordingly negatively charged. Such a configuration would not be optimal for cleaning electrically-charges particles 342 from the surface of the wafer chuck 322, since the top surface would only attract negatively-charged particles while repelling the positively charged particles, and the bottom surface would only attract positively-charged particles while repelling and dislodging negatively-charged particles. In the present embodiments, both positively-charged and negatively-charged particles are distributed as debris particles 324. Accordingly, for desirable performance in attracting both types of charged particles, the cleaning electrode 360 generates a symmetrical bi-polar electric field where a first pole is formed at one end of the surface and a second, oppositely charged pole is formed at an opposite end of the same surface from the first pole. In various embodiments, the cleaning electrode 360 has a diameter of 30±5 cm.

In order to accomplish this, a first portion of the surface where the first pole resides is electrically isolated from a second portion of the surface where the second pole resides. This is accomplished in various embodiments by placing an insulator material 363 between the first and second portions. Examples of good insulating material 363 include but are not limited to: poly-vinyl chloride (PVC), glass, rigid laminates, plastic resin, polytetrafluoroethylene, an air gap and rubber. The positive lead of an electrical power supply is attached to that portion where the positive pole is desired and the negative lead of the electrical power supply is attached to the remaining portion. In various embodiments, the poles are disposed on extreme opposite ends substantially at the center of the electrode surface. Upon the application of power, such as DC power, the cleaning electrode 360 will generate a bi-polar electric field with the poles formed at the desired locations.

Accordingly, with reference to FIG. 3A, the cleaning electrode 360 has a circular shape that includes a first semicircle 362 and a second semicircle 364, in various embodiments. In such embodiments, the first semicircle 362 is electrically insulated from the second semicircle 364 by insulating material 363. In some embodiments, insulating material 363 is disposed entirely around a periphery of each semicircle 362, 364. In some embodiments, the first semicircle 362 is positively-charged by a positive lead of the power source and the second semicircle 364 is negatively-charged by a negative lead of the power source. In such embodiments, the first semicircle 362 has the positive pole and the second semicircle 364 has the negative pole of the bi-polar symmetric electric field generated by the circular shape of the cleaning electrode 360 when it is charged. In various embodiments, the positive pole and negative pole are charged to the same absolute value so as to maintain symmetry of the bi-polar electric field generated thereby. In various embodiments, the first semicircle 362 and the second semicircle 364 are equally sized and each includes approximately one-half of the shape of the cleaning electrode 360. In other embodiments, the first semicircle 362 and second semicircle 364 are equal in size but less than one-half of the total surface area of the cleaning electrode 360, such as ⅓, ¼, ⅛ or the like, and the remaining portion is insulating material. The charged, bi-polar symmetric cleaning electrode 360 is swept across the surface of the wafer clamp 322 in a directional manner as shown, in various embodiments, to dislodge and attract particle debris 342 from between the burls 324 thereof. The wafer clamp mover 390 moves the wafer clamp 322 directionally (i.e., laterally and/or circularly) with respect to the cleaning electrode 360 in various embodiments. In various embodiments, the cleaning electrode 360 is placed 0.1 mm to 1 cm above the wafer clamp surface depending on the strength of the electric field (e.g., the weaker the field, the closer the cleaning electrode 360 is positioned). In various embodiments, the spectral and/or charge monitoring system 385 monitors the contaminant level of the surface of the wafer clamp 322, and the data therefrom is used by a controller 500 or the like to automatically continue or discontinue cleaning of the wafer clamp 322.

FIG. 3B is a second diagram of the bi-polar cleaning electrode 360 in accordance with some embodiments. Simply moving a static charged symmetrical bi-polar cleaning electrode 360 will not optimally remove the particle debris 342 from the surface of the wafer clamp 322. This is because negatively charged particles will be jostled and repelled instead of attracted by the negative semicircle 364 of the cleaning electrode 360, and positively charged particles 342 will likewise be jostled and repelled instead of attracted by the positive semicircle 362 of the cleaning electrode 360. Accordingly, it has been found that rotating or spinning the cleaning electrode 360 as it sweeps across the face of the wafer clamp 322 yields desirable particle removal results.

In order to spin the cleaning electrode 360, a motor 390, such as a DC motor or an alternating current (AC) motor, is attached to the cleaning electrode 360 via an axle 391 or the like. The motor 390 may be powered from the same or a separate AC or DC power source that is used to charge the cleaning electrode 360. The motor 390, when powered, rotates the axle 391, which in turn rotates the cleaning electrode 360. The motor 390 may be rated at between one and one hundred volts, in various embodiments. In various embodiments, the motor 390 spins the electrode at between 10 and 1000 rotations per minute (RPM). In various embodiments, the cleaning electrode 360 is spun in either clockwise or counter-clockwise directions. In some embodiments, the cleaning electrode 360 may be spun in a clockwise direction for a period, followed by being spun in the opposite direction for a period during the cleaning cycle.

In order to charge the cleaning electrode 360 while it is spun by the motor 390, leads are provided through the axle 391 such that they do not get spun up and tangled during its operation. Accordingly, the leads to charge the cleaning electrode 360 may include a power transfer device 392 such as an internal hard-wired slip ring, or a wireless power device.

A slip ring is an electromechanical device that allows the transmission of power and electrical signals from a stationary to a rotating structure, such as the motor 390 and the cleaning electrode 360. The slip ring improves system operation by eliminating the need for damage-prone wires that dangle from movable joints. Also called rotary electrical interfaces, rotating electrical connectors, collectors, swivels, or electrical rotary joints. A slip ring includes a stationary graphite or metal contact (brush) which rubs on the outside diameter of a rotating metal ring. As the metal ring turns, the electric current or signal is conducted through the stationary brush to the metal ring making the connection. Additional ring/brush assemblies are stacked along the rotating axis if more than one electrical circuit is needed. Either the brushes or the rings are stationary while the other component rotates.

In other embodiments, wireless power transmitters and receivers are used to provide power to charge the cleaning electrode 360 in place of slip rings. Wireless power transmitters include devices, such as inductive power transmitters that transmit power from an AC or DC power source to inductive power receivers (not shown) on or within the cleaning electrode 360. Other methods of powering the spinning cleaning electrode 360 are readily contemplated.

As shown in FIG. 3B, the spinning cleaning electrode 360 is swept over the entire surface area of the wafer clamp 322 in various embodiments. Positively and negatively charged particle 342 are attracted by the bi-polar symmetric electric field generated by the spinning cleaning electrode 360 and adsorbed (not absorbed) onto the surface of the spinning cleaning electrode 360. The debris particles 342 are held in place on the surface of the spinning cleaning electrode 360 by coulomb forces generated by a sufficiently strong electric field in various embodiments. The process of cleaning the surface of the wafer clamp 322 in this manner takes 1-5 complete passes of the cleaning electrode 360 over the entire surface area of the wafer clamp 322 in some embodiments. In various embodiments, the cleaning process using the cleaning electrode 360 is programmed to run for 10±2 minutes. In various embodiments, such cleaning processes are initiated periodically or after a threshold number of uses of the wafer clamp 322 during manufacturing by the apparatus 10. The spectral and/or charge monitoring system 385 may monitor the contaminant level of the surface of the wafer clamp 322 and the data therefrom may be used by a controller or the like to automatically continue or discontinue cleaning of the wafer clamp 322 based on the residual particle debris remaining. Adsorbed debris particles 342 are shown attached to the bottom surface of the cleaning electrode 360 after being attracted off the surface of the wafer chuck 322 using the generated symmetric electric field.

Figure 3C:
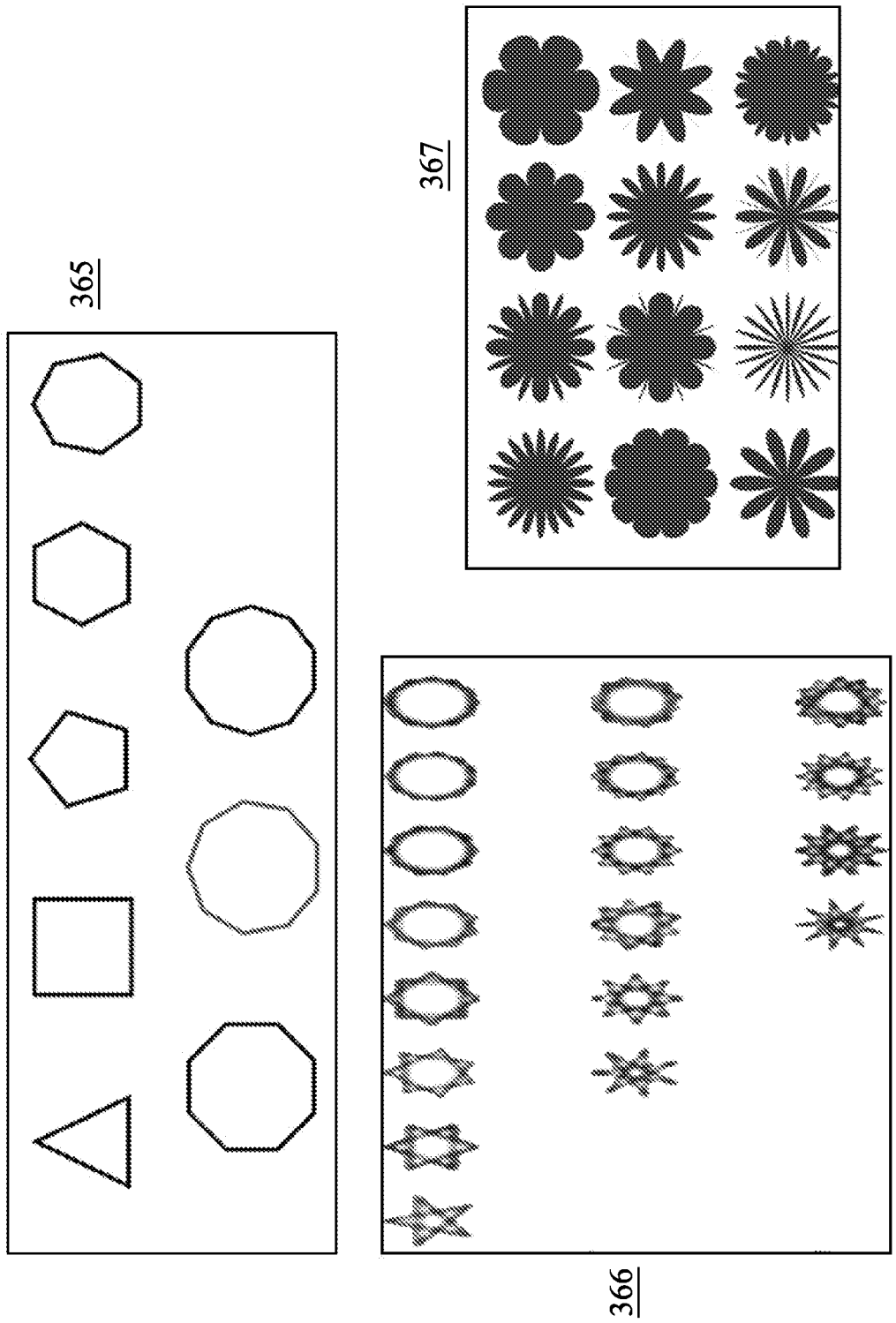
FIG. 3C is a diagram of alternate designs of the spinning electrode in accordance with some embodiments.

FIG. 3C is a diagram of alternate designs of the symmetrical cleaning electrode 360 in accordance with some embodiments. In some embodiments, the cleaning electrode 360 is not circular, but is instead formed as a regular polygon, where all the sides of the polygon are equal, and all the interior angles are the same. Diagram 365 shows types of available regular simple polygons including squares, pentagons, hexagons, heptagons, and so forth as the number of corners of the polygon are increased. Any regular n-polygon can be used and the electric field generated thereby will be increasingly symmetrical as the numbers of corners are increased, since the number of symmetrical axes increase in proportion to the number of corners. In addition, the surface area available to adsorb debris particles 342 also increases with the increasing number of corners.

In some embodiments, complex polygons can be used in place of a circular shape for the cleaning electrode 360, since they demonstrate symmetry with two or more symmetrical axes. Complex polygons, also called self-intersecting polygons, have sides that cross over each other. The classic star is a complex polygon. Such a "regular star polygon" is a self-intersecting, equilateral equiangular polygon. A regular star polygon is denoted by its Schläfli symbol $\{p/q\}$, where p (the number of vertices) and q (the density) are relatively prime (they share no factors) and $q \geq 2$. The density of a polygon can also be called its turning number, the sum of the turn angles of all the vertices divided by 360°. Diagram 366 shows various complex polygon shapes that may be used to form the cleaning electrode 360 in various embodiments. Complex polygons will be increasingly symmetrical as the numbers of points are increased, since the number of symmetrical axes increases in proportion to the number of points. In addition, the surface area available to adsorb debris particles 342 also increases with the increasing number of points, and with increasing thickness of the same.

In some embodiments, fan shapes can be used in place of a circular shape for the cleaning electrode 360, since they also demonstrate symmetry with two or more symmetrical axes. Diagram 367 illustrates various fan shapes that may be used as the cleaning electrode 360 in place of a circular shape. Such fan shapes will be increasingly symmetrical as the numbers of "blades" are increased, since the number of symmetrical axes increase in proportion to the number of such blades. In addition, the surface area available to adsorb debris particles 342 also increases with the increasing number and thickness of the blades. In these various embodiments, the simple polygon, complex polygon and fan-shaped electrodes described above will still need to have electrically isolated first and second portions, as described with respect to circular shapes, in order to generate a symmetrical bi-polar electric field.

Figure 4A:
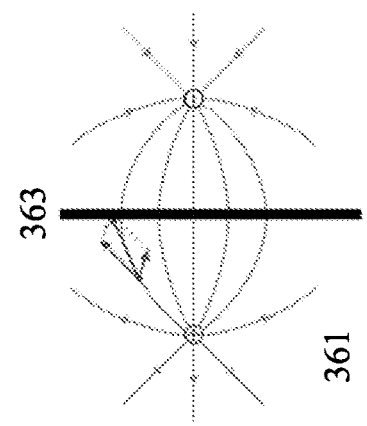
FIG. 4A is a diagram of measured contamination of the wafer clamp before stone cleaning in accordance with some embodiments.

FIG. 4A is a diagram 402 of measured contamination of the wafer clamp before stone cleaning in accordance with some embodiments, as measured by the spectral and/or charge monitoring system 385 or the like in various embodiments. As shown therein, a large contaminant debris particle 340 has formed on an area of the surface of the wafer clamp 322 before stone cleaning is applied. In various embodiments, the circumference of such particle debris 340 is on the order of 200±50 nm.

Figure 4B:
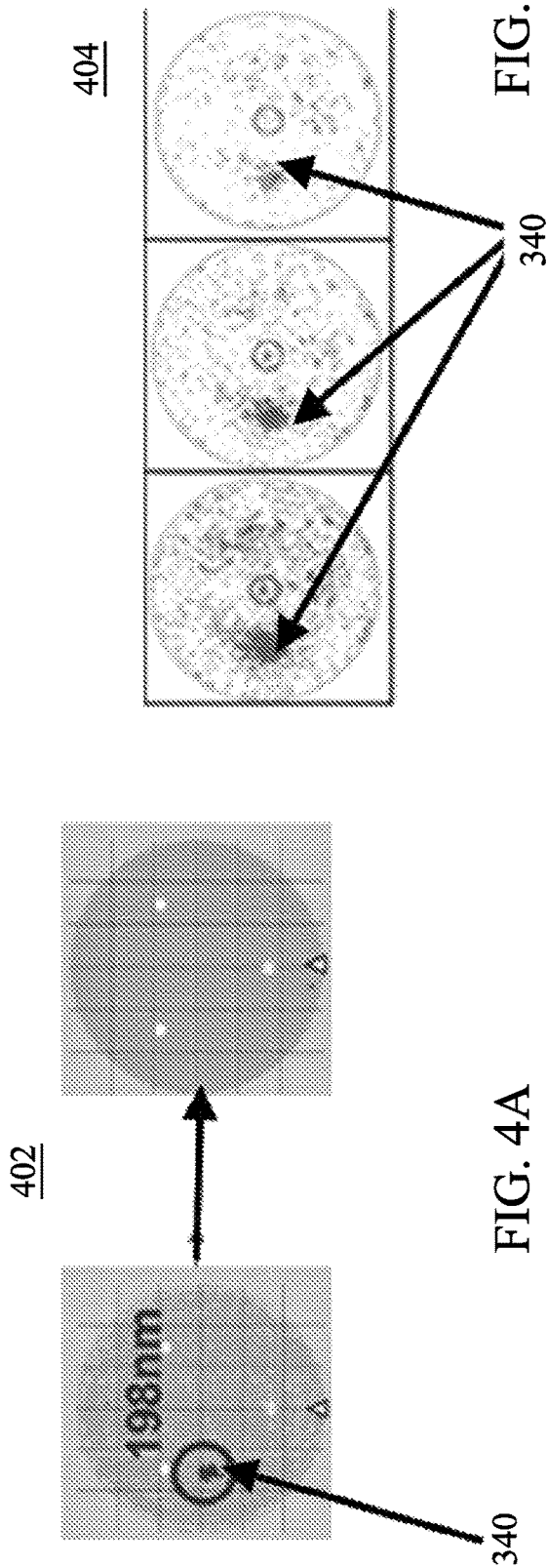
FIG. 4B is a diagram of measured contamination of the wafer clamp after stone cleaning in accordance with some embodiments.

FIG. 4B is a diagram 404 of measured contamination of the wafer clamp after stone cleaning has been performed in accordance with some embodiments. As shown in the successive panels from left to right, the size of the debris particles 340 is decreased during application of the stone cleaning in a standard cleaning operation.

Figure 4C:
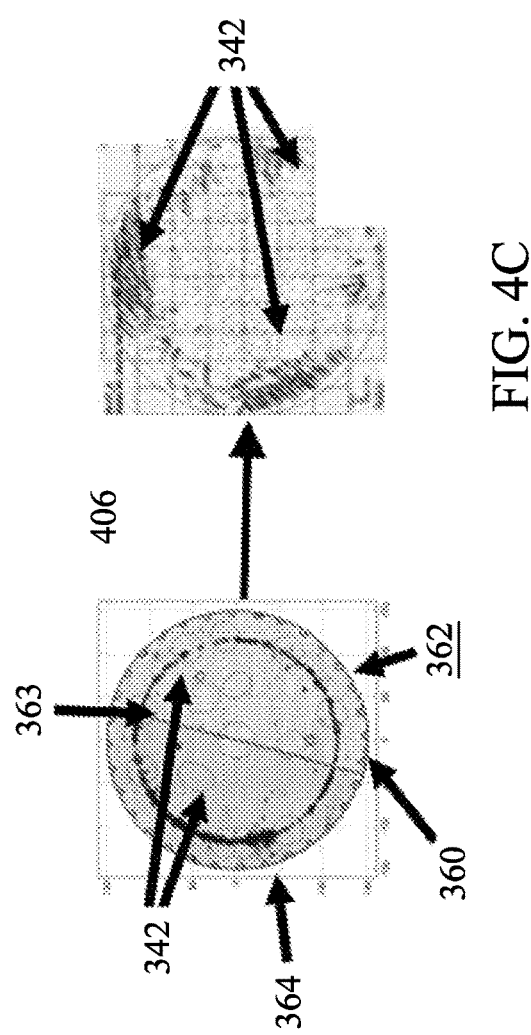
FIG. 4C is a diagram of measured contamination captured by the spinning electrode in accordance with some embodiments.

FIG. 4C is a diagram 406 of measured contamination adsorbed on the spinning cleaning electrode 360 in accordance with some embodiments, when performed after the stone cleaning. The left panel of the diagram 406 shows the smaller particle debris 342 adsorbed on the surface of the circular cleaning electrode 360, including on the first semicircle 362 and the second semicircle 364. The right panel shows the adsorbed particle debris 342 in greater detail. The symmetric bipolar electric field 361 generated by the cleaning electrode 360 is also shown with respect to the insulating material 363 thereon.

Figure 5A:
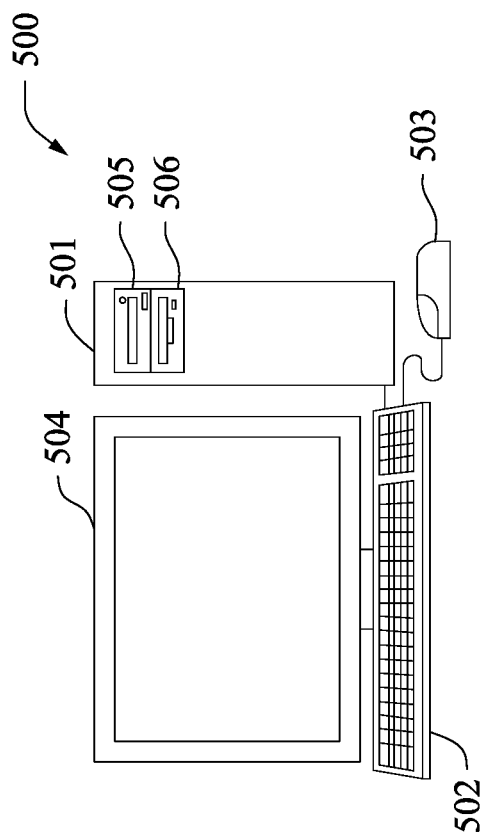
FIG. 5A and FIG. 5B are diagrams of a controller in accordance with some embodiments.
Figure 5B:
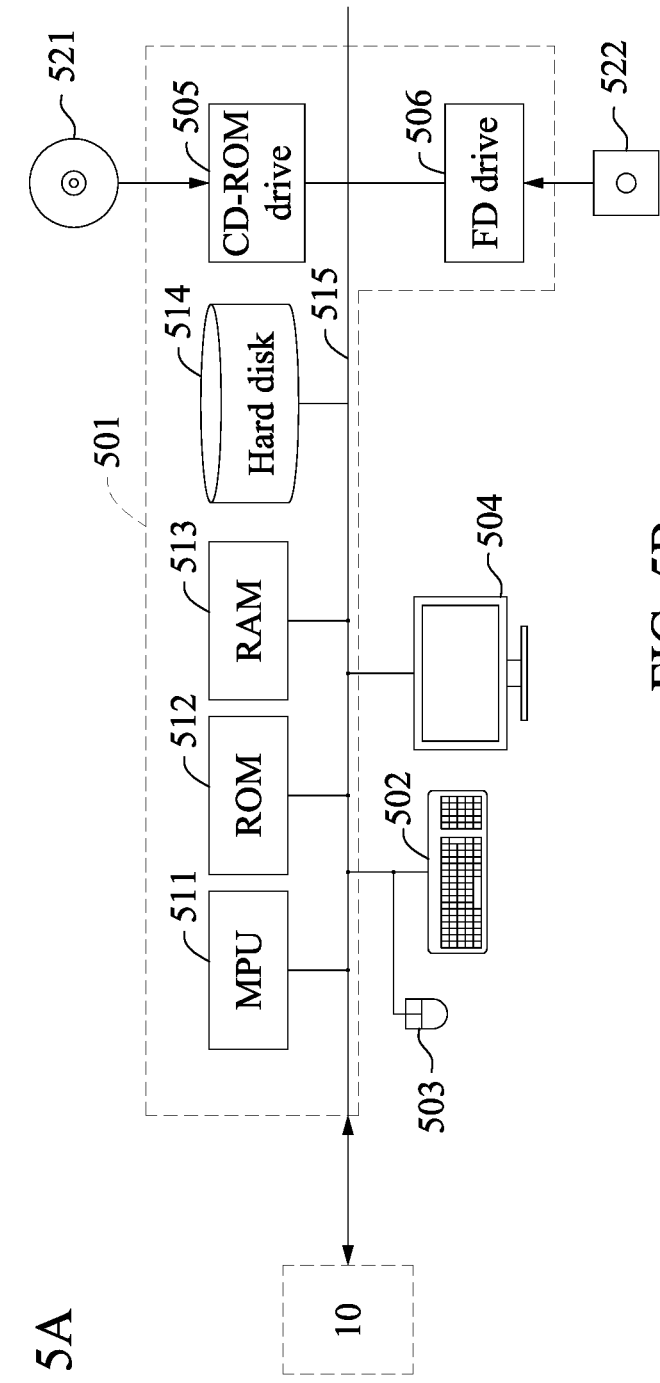

FIG. 5A and FIG. 5B illustrate a computer system 500 for controlling the system 10 and its components in accordance with various embodiments of the present disclosure. FIG. 5A is a schematic view of a computer system 500 that controls the system 10 of FIGS. 1A-1B. In some embodiments, the computer system 500 is programmed to initiate a process for monitoring contamination levels of wafer holding tools using the spectral and/or charge monitoring system 385 which is in communication therewith, and provide an alert that cleaning is required. In some embodiments, manufacturing of semiconductor devices is halted in response to such an alarm. As shown in FIG. 5A, the computer system 500 is provided with a computer 501 including an optical disk read only memory (e.g., CD-ROM or DVD-ROM) drive 505 and a magnetic disk drive 506, a keyboard 502, a mouse 503 (or other similar input device), and a monitor 504.

FIG. 5B is a diagram showing an internal configuration of the computer system 500. In FIG. 5B, the computer 501 is provided with, in addition to the optical disk drive 505 and the magnetic disk drive 506, one or more processors 511, such as a micro-processor unit (MPU) or a central processing unit (CPU); a read-only memory (ROM) 512 in which a program such as a boot up program is stored; a random access memory (RAM) 513 that is connected to the processors 511 and in which a command of an application program is temporarily stored, and a temporary electronic storage area is provided; a hard disk 514 in which an application program, an operating system program, and data are stored; and a data communication bus 515 that connects the processors 511, the ROM 512, and the like. Note that the computer 501 may include a network card (not shown) for providing a connection to a computer network such as a local area network (LAN), wide area network (WAN) or any other useful computer network for communicating data used by the computer system 500 and the system 10. In various embodiments, the controller 500 communicates via wireless or hardwired connection to the system 10 and its components that are described herein.

The program for causing the computer system 500 to execute the process for controlling the apparatus 10 of FIGS. 1A-1B, and components thereof and/or to execute the processes for manufacturing a semiconductor device according to the embodiments disclosed herein are stored in an optical disk 521 or a magnetic disk 522, which is inserted into the optical disk drive 505 or the magnetic disk drive 506, and transmitted to the hard disk 514. Alternatively, the program is transmitted via a network (not shown) to the computer system 500 and stored in the hard disk 514. At the time of execution, the program is loaded into the RAM 513. The program is loaded from the optical disk 521 or the magnetic disk 522, or directly from a network in various embodiments.

The stored programs do not necessarily have to include, for example, an operating system (OS) or a third party program to cause the computer 501 to execute the methods disclosed herein. The program may only include a command portion to call an appropriate function (module) in a controlled mode and obtain desired results in some embodiments. In various embodiments described herein, the controller 500 is in communication with the lithography system 10 to control various functions thereof.

The controller 500 is coupled to the apparatus 10 in various embodiments. The controller 500 is configured to provide control data to those system components and receive process and/or status data from those system components. For example, the controller 500 comprises a microprocessor, a memory (e.g., volatile or non-volatile memory), and a digital I/O port capable of generating control voltages sufficient to communicate and activate inputs to the processing system, as well as monitor outputs from the lithography apparatus 10. In addition, a program stored in the memory is utilized to control the aforementioned components of the lithography apparatus 10 according to a process recipe. Furthermore, the controller 500 is configured to analyze the process and/or status data, to compare the process and/or status data with target process and/or status data, and to use the comparison to change a process and/or control a system component. In addition, the controller 500 is configured to analyze the process and/or status data, to compare the process and/or status data with historical process and/or status data, and to use the comparison to predict, prevent, and/or declare a fault or alarm.

Figure 6:
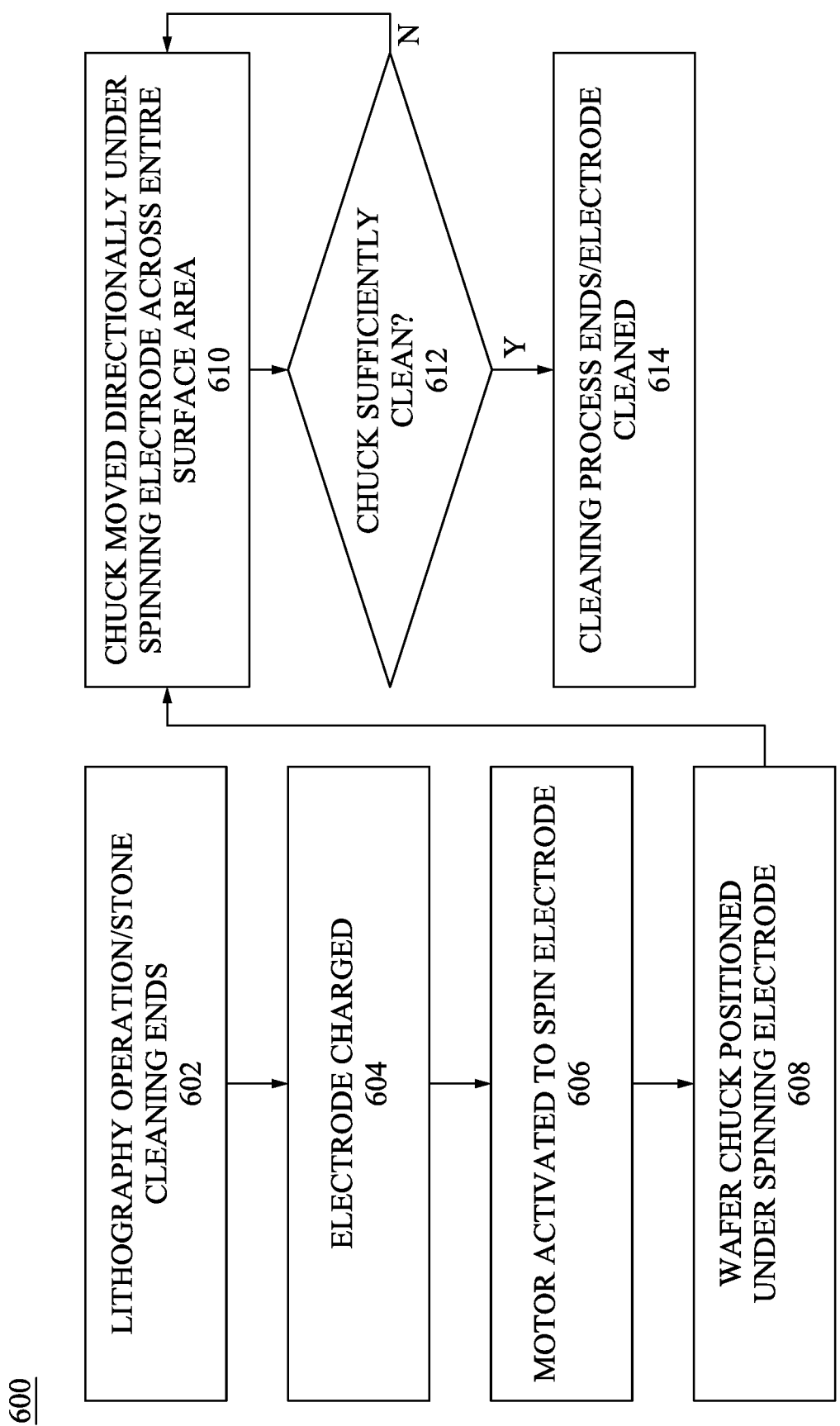
FIG. 6 is a flowchart of a cleaning process using the spinning electrode in accordance with some embodiments.

FIG. 6 is a flowchart of a cleaning process 600 using the spinning cleaning electrode 360 in accordance with some embodiments. In some embodiments, the process 600 is controlled by the controller 500. The cleaning process 600 commences after a lithography operation by the apparatus 10 is halted and the stone cleaning described above ends (operation 602) in various embodiments. Next, at operation 604, the cleaning electrode 360 is charged in various embodiments. The motor 390 is activated to spin the cleaning electrode 360 (operation 606) in one of the clockwise or counter-clockwise directions, or in both such directions in an alternating fashion, in various embodiments. The wafer chuck 322 is then placed in proximity to the spinning cleaning electrode 360 (operation 608) in various embodiments. In some embodiments, the wafer chuck 322 is placed under the spinning cleaning electrode 360. In some embodiments, the wafer chuck 322 is placed under the cleaning electrode 360, and then spinning of the cleaning electrode 360 commences. At operation 610, the wafer chuck 322 is moved directionally under electrode across its entire surface area in various embodiments. Such movement is lateral in a horizontal and/or vertical direction, as well as circularly as described previously above in some embodiments. Next, at operation 612, it is determined whether the wafer chuck 322 has been sufficiently cleaned. This determination is made by the controller 500 in some embodiments. The determination is made based on the duration of the cleaning process in some embodiments. The determination is made using data from the spectral and/or charge monitoring system 385 with respect to a threshold value or range in some embodiments. If the surface of the wafer chuck 322 is not sufficiently clean, the process 600 returns to operation 610 above in various embodiments. If the surface of the wafer chuck 322 is sufficiently clean, the process 600 instead continues to operation 614 where the cleaning process ends. The cleaning electrode 360 is then cleaned using debris collector 370 or the like using mechanical and/or electrical (i.e. reverse charge) processes in various embodiments. In various embodiments, the cleaning electrode 360 is cleaned in this manner without removing it from the processing chamber 306, thereby further reducing maintenance down-time.

This disclosure introduces methods and apparatus for cleaning the small electrically-charged particles 342 which accumulate between the burls 324 of a wafer chuck 322 using electrical force. Removal of such particles 342 greatly increases EUV lithographic system availability and reduces the cost of parts removal and replacement. Moreover, the manufacturing yield of the apparatus 10 is improved due to fewer overlay errors, resulting in improved exposure quality on the scanner side.

According to various embodiments, a lithography apparatus includes a wafer chuck having a surface, a cleaning electrode for generating an electric field, and a motor for spinning the cleaning electrode. In such embodiments, when the cleaning electrode is spinning in proximity to the wafer chuck, electrically-charged particles are adsorbed by the cleaning electrode from the wafer chuck surface. In some embodiments, the wafer clamp is an electrostatic chuck. In some embodiments, the shape of the cleaning electrode has at least two axes of symmetry. In some embodiments, the shape is circular and the electric field is a bi-polar electric field. In some embodiments, the shape is a regular polygon and the electric field is a bi-polar electric field. In some embodiments, the shape is one of a star shape and a fan shape, and the electric field is a bi-polar electric field. In some embodiments, the apparatus includes at least one of an alternating current (AC) power source, a direct current (DC) power source and a wireless electrical power source for charging the cleaning electrode. In some embodiments, the cleaning electrode has a first positively-charged portion and second negatively-charged portion, where the first and second portions are electrically isolated. In some embodiments, the first positively-charged portion is approximately half the shape and the second negatively-charged portion is approximately half the shape. In some embodiments, the apparatus includes an axle connecting the motor to the cleaning electrode. In some embodiments, the apparatus includes a slip ring for powering the cleaning electrode. In some embodiments, the apparatus includes a debris collector for removing the electrically-charged particles from the cleaning electrode.

According to various embodiments, a method for removing contamination from a lithography device includes disposing a bi-polar electrode above a surface of a wafer clamp, charging the bi-polar electrode; spinning the bi-polar electrode; and moving at least one of the wafer clamp and the bi-polar electrode relative to each other such that electrically-charged particles on the surface of the wafer clamp are attracted onto a surface of the bi-polar electrode while the bi-polar electrode is spinning. In some embodiments, the bi-polar electrode generates a symmetric electric field. In some embodiments, the bi-polar electrode spins in one or both of the clockwise and a counterclockwise directions. In some embodiments, the wafer clamp is moved laterally and/or circularly relative to the bi-polar electrode. In some embodiments, the wafer surface is cleaned with a cleaning stone which generates the electrically-charged particles that are later cleaned by the cleaning electrode. In some embodiments, the electrically-charged particles are subsequently removed from the bi-polar electrode using a debris collector disposed within the lithography apparatus.

According to various embodiments, a method for removing contamination from a lithography device includes removing large contaminant particles having a first size from a wafer chuck surface using a cleaning stone. In such embodiments, a cleaning electrode having a symmetrical surface with at least two axes of symmetry is then placed above the wafer chuck surface. In such embodiments, the cleaning electrode is then charged to generate a symmetrical electric field. In such embodiments, the cleaning electrode spins above the wafer chuck surface so that electrically-charged residue particles having a second size are adsorbed by the symmetrical surface of the electrode from the wafer chuck surface using the symmetrical electric field, wherein the first size is larger than the second size. In some embodiments, the wafer chuck surface is moved laterally and/or circularly relative to the cleaning electrode while the cleaning electrode is spinning.

The foregoing outlines features of several embodiments or examples so that those skilled in the art better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography apparatus comprising:
   a wafer chuck having a surface;
   a cleaning stone configured to remove large contaminant particles from the surface of the wafer chuck and generate small residue particles;
   a charge-monitor system configured to charge the small residue particles to generate electrically-charged small residue particles using x-rays or an ion beam;
   a cleaning electrode configured to generate an electric field; and
   a motor for spinning the cleaning electrode, wherein when the cleaning electrode is spinning in proximity to the wafer chuck, the electrically-charged small residue particles are adsorbed by the cleaning electrode from the surface.

2. The lithography apparatus of claim 1, wherein the wafer chuck is an electrostatic chuck.

3. The lithography apparatus of claim 1, wherein the cleaning electrode comprises a shape with at least two axes of symmetry.

4. The lithography apparatus of claim 3, wherein the shape is circular and the electric field is a bi-polar electric field.

5. The lithography apparatus of claim 3, wherein the shape is a regular polygon and the electric field is a bi-polar electric field.

6. The lithography apparatus of claim 3, wherein the shape is one of a star shape and a fan shape, and wherein the electric field is a bi-polar electric field.

7. The lithography apparatus of claim 3 further comprising at least one of: an alternating current (AC) power source, a direct current (DC) power source and a wireless electrical power source for charging the cleaning electrode.

8. The lithography apparatus of claim 7, the cleaning electrode further having a first positively-charged portion and second negatively-charged portion that are electrically isolated.

9. The lithography apparatus of claim 8, wherein the first positively-charged portion comprises substantially half the shape and the second negatively-charged portion comprises substantially half the shape.

10. The lithography apparatus of claim 1, further comprising an axle connecting the motor to the cleaning electrode.

11. The lithography apparatus of claim 1, further comprising a slip ring for powering the cleaning electrode.

12. The lithography apparatus of claim 1, further comprising a debris collector for removing the electrically-charged small residue particles from the cleaning electrode.

13. A method for removing contamination from a lithography device, comprising:
- removing large contaminant particles from a surface of a wafer clamp by a cleaning stone and generating small residue particles;
- charging the small residue particles to generate electrically-charged small residue particles using x-rays or an ion beam;
- disposing a bi-polar electrode above the surface of the wafer clamp;
- charging the bi-polar electrode;
- spinning the bi-polar electrode; and
- moving at least one of the wafer clamp and the bi-polar electrode relative to each other such that electrically-charged small residue particles on the surface of the wafer clamp are attracted onto a surface of the bi-polar electrode while the bi-polar electrode is spinning.

14. The method of claim 13, further comprising:
generating a symmetric electric field with the bi-polar electrode.

15. The method of claim 14, further comprising:
spinning the bi-polar electrode in at least one of a clockwise and a counterclockwise direction.

16. The method of claim 14, further comprising:
moving the wafer clamp at least one of laterally and circularly relative to the bi-polar electrode.

17. The method of claim 14, wherein:
the removing the large contaminant particles from the surface of the wafer clamp by the cleaning stone and the generating the electrically-charged small residue particles are performed prior to said disposing the bi-polar electrode above the surface of the wafer clamp.

18. The method of claim 14, further comprising removing the electrically-charged small residue particles from the bi-polar electrode using a debris collector.

19. A lithography apparatus for cleaning a wafer chuck, comprising:
- a cleaning stone configured to remove large contaminant particles from a surface of the wafer chuck and generate small residue particles;
- a charge-monitor system configured to charge the small residue particles to generate electrically-charged small residue particles using x-rays or an ion beam;
- a bi-polar electrode having a symmetrical surface with at least two axes of symmetry, and comprising a first and a second pole portions that are respectively formed at a first and a second ends of the symmetrical surface and oppositely charged; and
- a motor configured to spin the bi-polar electrode so that the electrically-charged small residue particles are absorbed from a surface of the wafer chuck when the bi-polar electrode is in proximity to the wafer chuck.

20. The lithography apparatus of claim 19,
wherein the first and the second pole portions are isolated from each other by an insulating material on the bi-polar electrode, and
wherein the insulating material comprises one of glass, plastic resin, an air gap, or rubber.

* * * * *